(12) United States Patent
Kosaka et al.

(10) Patent No.: US 8,476,166 B2
(45) Date of Patent: Jul. 2, 2013

(54) MANUFACTURING METHOD OF SEMICONDUCTOR DEVICE

(75) Inventors: Toshiyuki Kosaka, Kanagawa (JP); Haruo Kawata, Kanagawa (JP); Tsutomu Komatani, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 314 days.

(21) Appl. No.: 12/893,481

(22) Filed: Sep. 29, 2010

(65) Prior Publication Data

US 2011/0081784 A1    Apr. 7, 2011

(30) Foreign Application Priority Data

Oct. 1, 2009   (JP) .................................. 2009-229508

(51) Int. Cl.
*H01L 21/311*    (2006.01)

(52) U.S. Cl.
USPC ........... 438/694; 438/689; 438/700; 438/704; 438/706; 438/710; 438/712; 438/718; 438/735; 438/736; 438/737; 438/738

(58) Field of Classification Search
None
See application file for complete search history.

(56) References Cited

U.S. PATENT DOCUMENTS

| | | | |
|---|---|---|---|
| 2008/0087634 A1* | 4/2008 | Kohsaka et al. | 216/41 |
| 2009/0001478 A1* | 1/2009 | Okamoto | 257/382 |

* cited by examiner

*Primary Examiner* — Lan Vinh
*Assistant Examiner* — Jiong-Ping Lu
(74) *Attorney, Agent, or Firm* — Westerman, Hattori, Daniels & Adrian, LLP

(57) ABSTRACT

A manufacturing method of a semiconductor device includes: forming step of forming an etching mask on a second main face of a substrate, the etching mask being made of Cu or Cu alloy and having an opening, the second main face being on an opposite side of a first main face of the substrate where a nitride semiconductor layer is provided; a first etching step of applying a dry etching to the second main face of the substrate with use of the etching mask so that all of or a part of the nitride semiconductor layer is left; a removing step of removing the etching mask after the first etching step; and a second etching step of dry-etching the left nitride semiconductor layer after the removing step.

12 Claims, 7 Drawing Sheets

(a)

(b)

(c)

MANUFACTURING METHOD OF SEMICONDUCTOR DEVICE

CROSS-REFERENCE TO RELATED APPLICATION

This application is based upon and claims the benefit of priority of the prior Japanese Patent Application No. 2009-229508 filed on Oct. 1, 2009, the entire contents of which are incorporated by reference.

BACKGROUND (i) Technical Field

A certain aspect of the embodiments discussed herein is related to a manufacturing method of a semiconductor device.

(ii) Related Art

A mask, in which NiCri (nickel chrome), Au (gold) and Ni (nickel) are layered from a substrate side, is used as an etching mask in a forming process of a via hole of GaN (gallium nitride)—FET (Field Effect Transistor). With the method, fluorine-based gas (for example $SF_6$) of an etching gas and Ni of the etching mask are mixed with each other. As a result, Ni fluoride is left on a sidewall of the via hole as a residue. Japanese Patent Application Publication No. 2008-98456 (herein after referred to as Document 1) discloses a method of using a Cu (copper) mask as the etching mask instead of the Ni mask.

However, with an art of Document 1, Cu may cause contamination of semiconductor. This may result in device property degradation, reliability degradation or the like.

SUMMARY

According to an aspect of the present invention, there is provided a manufacturing method of a semiconductor device including: forming step of forming an etching mask on a second main face of a substrate, the etching mask being made of Cu or Cu alloy and having an opening, the second main face being on an opposite side of a first main face of the substrate where a nitride semiconductor layer is provided; a first etching step of applying a dry etching to the second main face of the substrate with use of the etching mask so that all of or a part of the nitride semiconductor layer is left; a removing step of removing the etching mask after the first etching step; and a second etching step of dry-etching the left nitride semiconductor layer after the removing step.

DETAILED DESCRIPTION

A description will be given of a best mode for carrying the present invention.

(First Embodiment)

Figure 1:
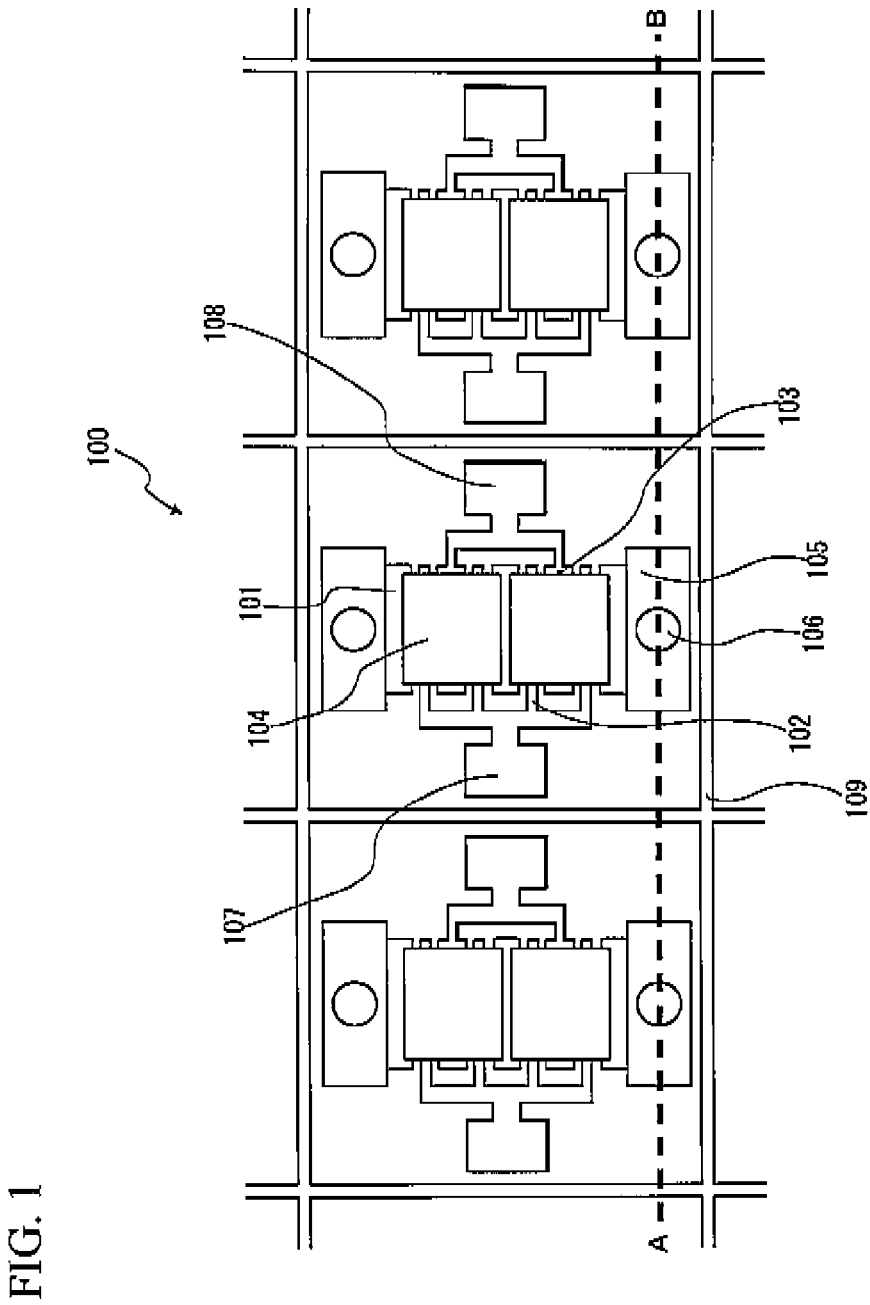
FIG. 1 illustrates a plane view of a semiconductor device.

FIG. 1 illustrates a plane view of a semiconductor device 100. In the semiconductor device 100, a plurality of FETs are coupled in parallel in a gate length direction. Each source electrode 101 is coupled to each other with a source air bridge 104 extending from a gate electrode 102 to a drain electrode 103. An outside source pad 105 is coupled to a PHS 70 on a reverse side through a via hole 106. Each gate electrode 102 is coupled to a gate pad 107. Each drain electrode 103 is coupled to a drain pad 108. The semiconductor device 100 is divided into chips by cutting the semiconductor device 100 along a scribing line 109 illustrated in FIG. 1.

Figure 2A:
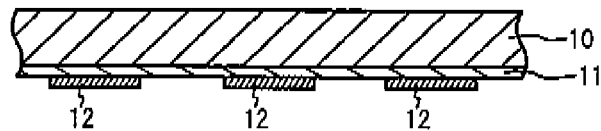
FIG. 2A to FIG. 2F illustrate a flow of a manufacturing method of a semiconductor device in accordance with a first embodiment.

FIG. 2A to FIG. 2F and FIG. 3A to FIG. 3D illustrate a manufacturing method of the semiconductor device 100. In FIG. 2A to FIG. 2F and FIG. 3A to FIG. 3D, a cross sectional view of the semiconductor device 100 in a case where the wafer of FIG. 1 is cut off along a line A-B is illustrated. As illustrated in FIG. 2A, a SiC substrate 10 is prepared. A GaN(gallium nitride)-based semiconductor layer 11 is formed on a first main face of the SiC substrate 10. In the embodiment, the GaN-based semiconductor layer 11 may be made of GaN, AlGaN, TnGaN, AlInGaN or the like. For example, the GaN-based semiconductor layer 11 has a structure in which i-GaN, n-AlGaN and n-GaN are layered on the SiC substrate 10 in this order. A buffer layer may be provided between the SiC substrate 10 and the GaN-based semiconductor layer 11. The buffer layer is made of a material other than GaN-based semiconductor. The buffer layer may be made of AlN or AlGaN.

The first main face of the SiC substrate 10 is a face where an active region, a circuit and so on are provided. In FIG. 2A, a lower face of the SiC substrate 10 acts as the first main face. The GaN-based semiconductor layer 11 has a thickness of approximately 1 μm. A surface source pad 12 is formed on a face of the GaN-based semiconductor layer 11 on an opposite side of the SiC substrate 10. The surface source pad 12 has a structure in which Ni (nickel) and Au (gold) are layered in this order from the GaN-based semiconductor layer 11 side.

Figure 2B:
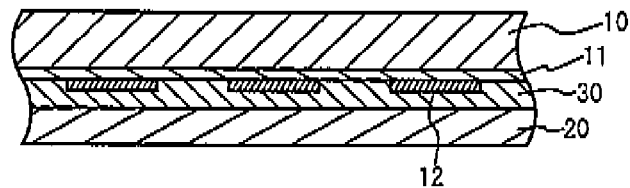

Next, as illustrated in FIG. 2B, a support substrate 20 and the SiC substrate 10 are thermally jointed to each other in vacuum atmosphere with use of a temporary joint agent 30. The temporary joint agent 30 may be a wax. The support substrate 20 is jointed to the sic substrate 10 in order to enhance a retention capacity of the SiC substrate 10.

Figure 2C:
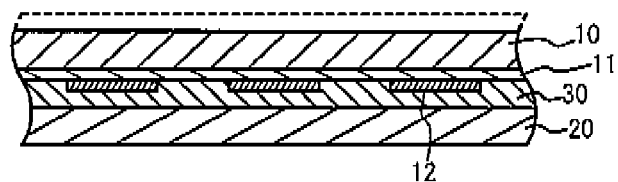

Next, as illustrated in FIG. 2C, a second main face (a face on an opposite side of the first main face) is polished or grinded so that the thickness of the SiC substrate 10 is reduced to a desirable wafer thickness. In the embodiment, a target wafer thickness of the SiC substrate 10 is 150 μm.

Figure 2D:
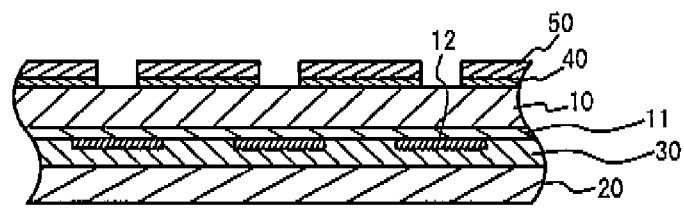

Next, as illustrated in FIG. 2D, a seed metal 40 is formed on the second main face of the SiC substrate 10. The seed metal 40 has an opening in an area facing the surface source pad 12. The seed metal 40 has a structure in which NiCr (50 nm) and Au (200 nm) are layered in this order from the SiC substrate 10 side. The seed metal 40 may be Ni, Ta, Ti or the like. It is preferable that NiCr is used as the seed metal 40, considering processability and adhesiveness with the substrate. The seed metal 40 is, for example, formed with a film formation method such as a sputtering. After that, an etching mask 50 is formed with a plating method with use of the seed metal 40. The etching mask 50 is made of Cu (copper) or Cu alloy. The Cu alloy may be CuMo (molybdenum), CuW (tungsten) or the like. The thickness of the etching mask 50 is approximately 10 μm. Details of the process of FIG. 2D are described later.

Figure 2E:
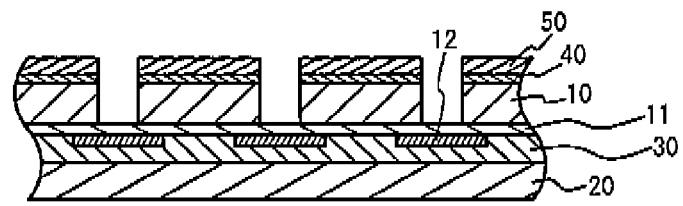

Next, as illustrated in FIG. 2E, the SiC substrate 10 is subjected to a dry etching process. An ICP etching apparatus can be used in the dry etching process. $SF_6$ may be used as an etching gas. A fluorine-based gas such as $CF_4$ gas or $NF_3$ gas may be used as the etching gas. The etching gas may be a mixed gas of any of the above fluorine-based gas, $O_2$ (Oxygen) gas and Ar (Argon) gas. A vacuum degree may be 0.1 Pa to 10.0 Pa. An electrical power of high-density plasma formation of the ICP etching apparatus may be 100 W to 3000 W. A bias electrical power of the ICP etching apparatus may be 10 W to 1000 W. SiC at the opening of the etching mask 50 is etched. Thus, a via hole is formed. Details of the process of FIG. 2E are described later.

Figure 2F:
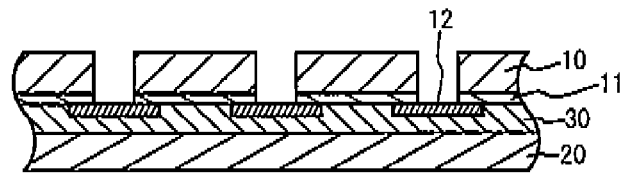

Next, As illustrated in FIG. 2F, the GaN-based semiconductor layer 11 is subjected to an etching process after removing the etching mask 50 and the seed metal 40. Thus, the surface source pad 12 is exposed, and a via hole is formed in the SiC substrate 10. For example, the ICP etching apparatus may be used in the etching process of the GaN-based semiconductor layer 11. The etching gas of the etching process of the GaN-based semiconductor layer 11 may be the same as that of the etching process of the SiC substrate 10. In this case, the etching gas of the etching mask 50 and the GaN-based semiconductor layer 11 can be used in common in both of the etching processes. Therefore, a process is simplified. However, an etching rate of fluorine-based gas against GaN is lower than against the SiC substrate 10. Therefore, $Cl_2$ gas having an etching rate against GaN higher than against the SiC substrate 10 may be used in the etching against the GaN-based semiconductor layer 11. That is, a via hole can be formed effectively, when an etching gas having an etching selectivity against one than against the other is used in the etching process of the SiC substrate 10 and the GaN-based semiconductor layer 11. A chlorine-based gas such as $BCl_3$ or $SiCl_4$ may be used as another chlorine-based gas. Details of the process of FIG. 2F are described later.

Figure 3A:
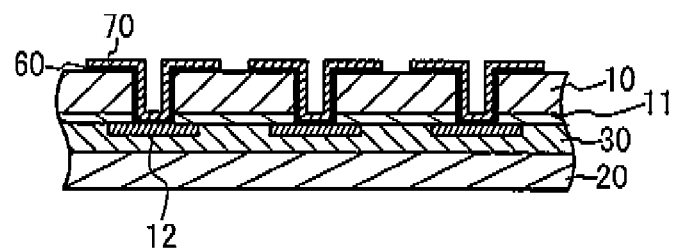
FIG. 3A to FIG. 3D illustrate the flow of a manufacturing method of a semiconductor device in accordance with the first embodiment.

Next, as illustrated in FIG. 3A, a seed metal 60 is formed on the second main face of the SiC substrate 10 with a sputtering method. In this case, the seed metal 60 is formed in the via hole of the SiC substrate 10. The seed metal 60 has a structure in which NiCr (50 nm) and Au (200 nm) are layered in this order from the SiC substrate 10 side. After that, the seed metal 60 is subjected to a patterning process. The SiC substrate 10 is divided into each semiconductor device 100. Next, the seed metal 60 is subjected to a non-electrolytic plating. Thus, the PHS (Plated Heat Sink) 70 is formed on the surface of the seed metal 60. The PHS 70 may be Au having a thickness of 1 μm to 40 μm.

Figure 3B:
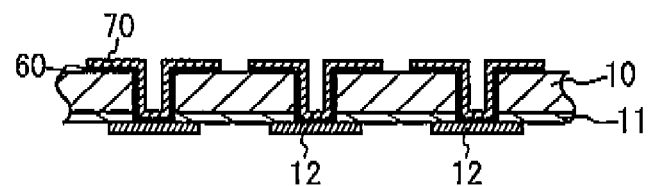
Figure 3C:
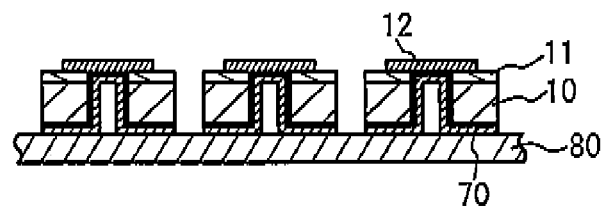
Figure 3D:
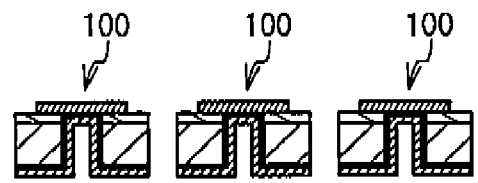

Next, as illustrated in FIG. 3B, the SiC substrate 10 is peeled from the support substrate 20 and the temporary joint agent 30. The surface of the surface source pad 12 is cleaned when the first main face of the SiC substrate 10 is cleaned with an organic material. As illustrated in FIG. 3C, a dicer tape 80 is adhered to the second main face of the SiC substrate 10. The SiC substrate 10 is turned upside down with rotation. After that, the SiC substrate 10 is subjected to a dicing in a thickness direction of the SiC substrate 10 along a scribing line. Thus, a plurality of chipped semiconductor devices 100 are fabricated.

FIG. 4A to FIG. 4E and FIG. 5A to FIG. 5C illustrate a flow for accounting details of the processes of FIG. 2D to FIG. 2F. A description will be given of details of the processes of FIG. 2D to FIG. 2F with reference to FIG. 4A to FIG. 4E and FIG. 5A to FIG. 5C.

Figure 4A:
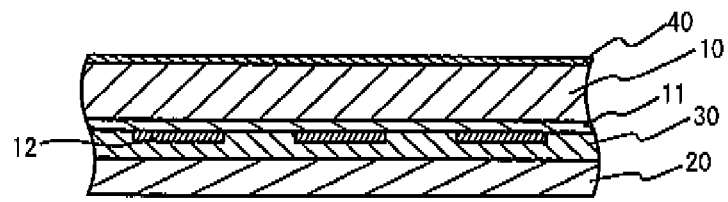
FIG. 4A to FIG. 4E illustrate a flow illustrating details of a process of FIG. 2D.
Figure 4B:
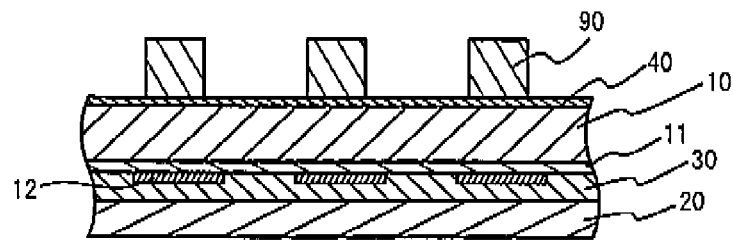

As illustrated in FIG. 4A, the seed metal 40 is formed on the second main face of the SiC substrate 10. In this case, the seed metal 40 is also formed on a side face of the SiC substrate 10. Next, as illustrated in FIG. 4B, a resist mask 90 is formed at an area facing the surface source pad 12 on the second main face of the seed metal 40. The resist mask 90 may be formed with an exposure process and a development process.

Figure 4C:
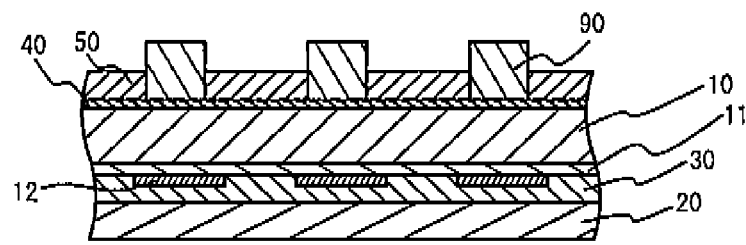
Figure 4D:
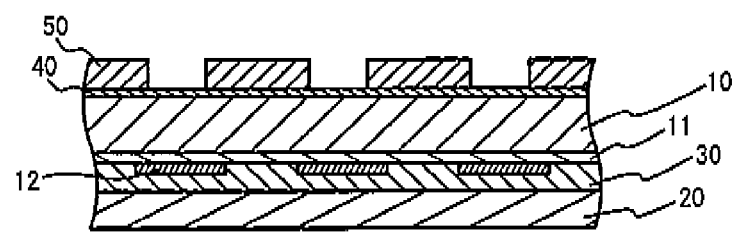
Figure 4E:
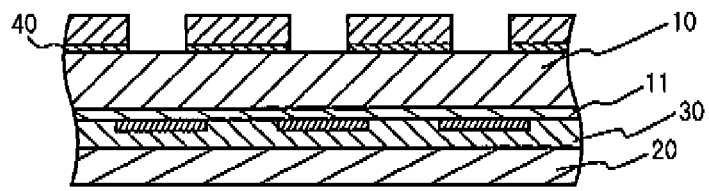

Next, as illustrated in FIG. 4C, an exposed area of the seed metal 40 not covered with the resist mask 90 is used as a seed metal. And the etching mask 50 is formed with a plating method. Next, as illustrated in FIG. 4D, the resist mask 90 is removed. After that, as illustrated in FIG. 4E, the seed metal 40 exposed after removing of the resist mask 90 is removed with an etching process.

Figure 5A:
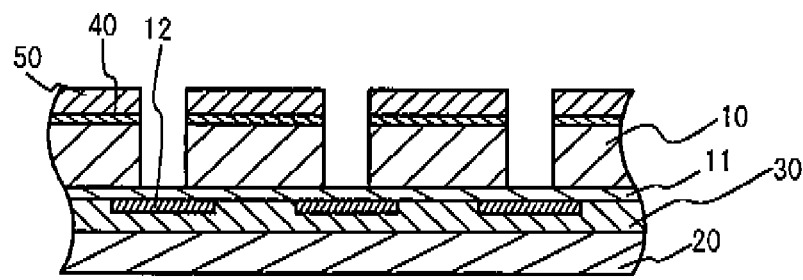
FIG. 5A to FIG. 5C illustrate a flow illustrating details of processes of FIG. 2E to FIG. 2F.

Next, as illustrated in FIG. 5A, the SiC substrate 10 is subjected to a dry etching process. In this case, the etching process is performed so that all of or a part of the GaN-based semiconductor layer 11 is left. However, it is preferable that the etching process is stopped before the GaN-based semiconductor layer 11 is exposed. That is, it is preferable that a part of the SiC substrate 10 is left on the GaN-based semiconductor layer 11. This is because Cu contamination to the GaN-based semiconductor layer 11 is restrained more.

Figure 5B:
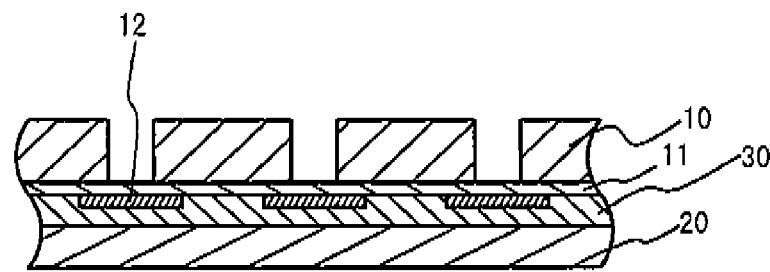

Next, as illustrated in FIG. 5B, the etching mask 50 and the seed metal 40 are removed. The seed metal 40 may not be removed. The seed metal 40 can be used when the PHS 70 is formed on the seed metal 40 in another process (FIG. 3A). A hot concentrated sulfuric acid, a nitric acid or the like is used as the etching liquid in the etching process of the etching mask 50. An etching time is approximately 5 minutes. After that, the etching liquid is removed with water washing. The water is dried with a spin dryer or the like. Next, an Au-based etching liquid is used as the etching liquid in the etching process of the Au of the seed metal 40. The etching time is approximately 5 minutes. After that, the etching liquid is removed with water washing. The water is dried with the spin drier or the like. Next, a concentrated hydrochloric acid is used as the etching liquid in the etching process of NiCr of the seed metal 40. The etching time is approximately 5 minutes. After that, the etching liquid is removed with water washing. The water is dried with the spin drier or the like.

Figure 5C:
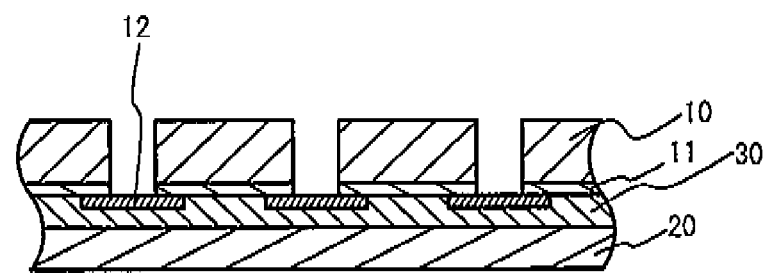

Cu fluoride residue is removed in the etching process of FIG. 5B even if the Cu fluoride residue is adhered to an inner wall of the via hole in the process of FIG. 5A, because the Cu fluoride is soluble in a chemical liquid. Next, the GaN-based semiconductor layer 11 is subjected to an etching process as illustrated in FIG. 5C. In this case, the GaN-based semiconductor layer 11 is etched after the left SiC in the via hole is removed.

The etching process of the etching mask 50 and the etching process of the GaN-based semiconductor layer 11 are performed in a same etching process, if the etching gas used in the etching process of the GaN-based semiconductor layer 11 can etch Cu. The etching mask 50 can be removed before exposing the GaN-based semiconductor layer 11 and after that the GaN-based semiconductor layer 11 can be subjected to the etching process, when an etching gas having a higher etching rate with respect to the Cu than with respect to GaN. In this case, the processes can be simplified.

In the embodiment, an upper face of the etching mask is made of Cu, and Ni is exposed on a side face of the etching mask, when the dry etching with use of the fluorine-based gas is performed. Therefore, adhesion of Ni fluoride, which is slightly soluble to a chemical liquid, to the inner sidewall of the via hole is restrained. Cu fluoride composing the etching mask 50 may be adhered to the inner wall of the via hole. However, the Cu fluoride can be removed easily, compared to the Ni fluoride. Therefore, the Cu fluoride is hardly left in the via hole in a subsequent chemical liquid process or in the etching process of the GaN-based semiconductor layer 11.

The etching of the GaN-based semiconductor layer 11 is performed after the etching mask 50 is removed. Therefore, the Cu contamination to the GaN-based semiconductor layer 11 is restrained. Accordingly, device property degradation, reliability degradation or the like of the semiconductor device 100 is restrained.

With the manufacturing method of the semiconductor device in accordance with the embodiment, the residue is hardly left on the inner wall of the via hole, and the device property degradation, the reliability degradation or the like of the semiconductor device is restrained.

Modified Embodiment

FIG. 6A to FIG. 6F illustrate a modified embodiment of FIG. 4A to FIG. 4E. A description will be given of the modified embodiment of FIG. 4A to FIG. 4E with reference to FIG. 6A to FIG. 6F.

Figure 6A:
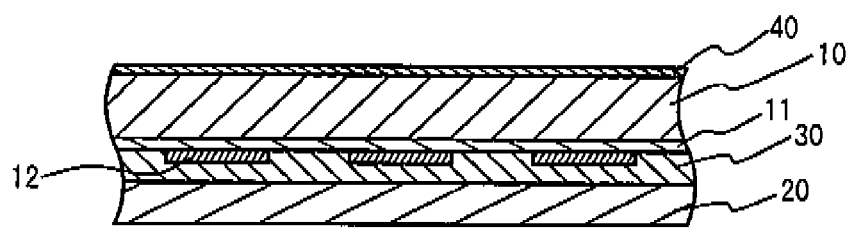
FIG. 6A to FIG. 6F illustrate a flow illustrating a modified embodiment of the process of FIG. 2D.
Figure 6B:
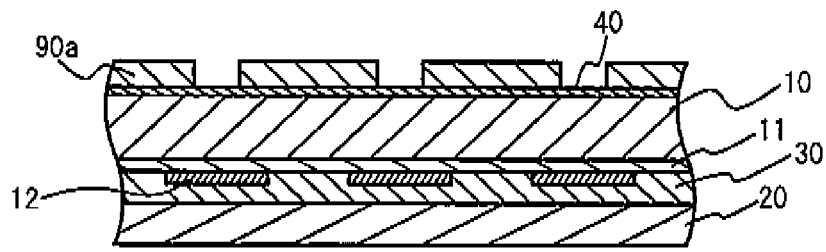
Figure 6C:
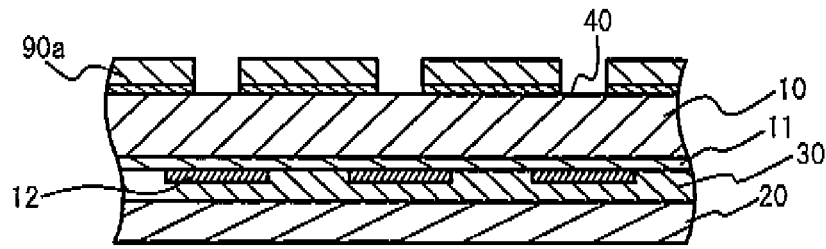

As illustrated in FIG. 6A, the seed metal 40 is formed on the second main face of the SiC substrate 10. In this case, the seed metal 40 is also formed on a side face of the SiC substrate 10. Next, as illustrated in FIG. 6B, a resist mask 90a is formed on the second main face of the seed metal 40. The resist mask 90a has an opening in an area facing the surface source pad 12. The resist mask 90a is formed with an exposure process and a development process. Next, as illustrated in FIG. 6C, an exposed area of the seed metal 40 not covered with the resist mask 90a is subjected to an etching process.

Figure 6D:
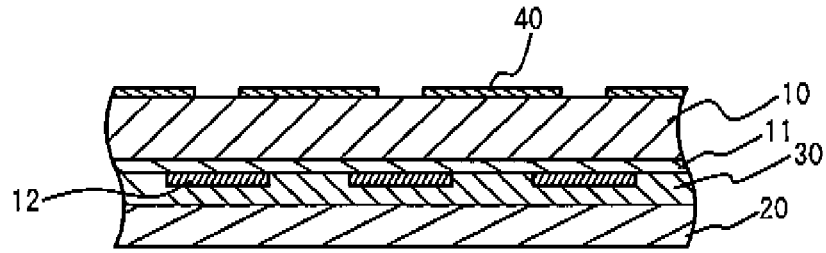
Figure 6E:
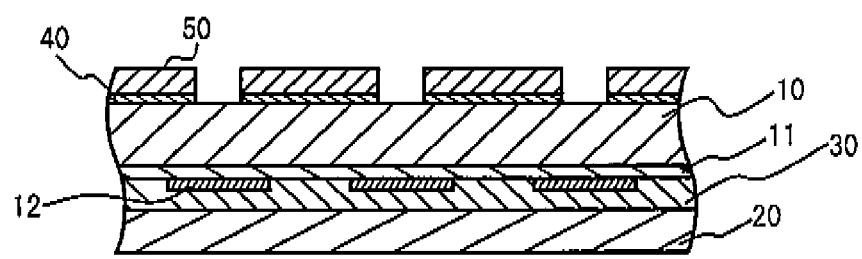
Figure 6F:
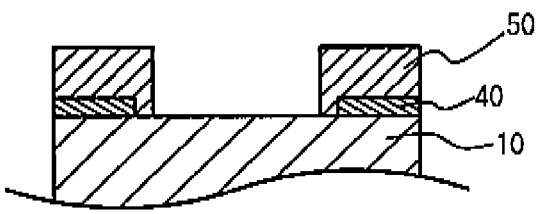

After that, as illustrated in FIG. 6D, the seed metal 40 having an opening in an area facing the surface source pad 12 is formed by removing the resist mask 90a. Next, as illustrated in FIG. 6E, the seed metal 40 is used as a seed metal, and the etching mask 50 made of Cu is formed with a plating method. FIG. 6F illustrates an enlarged view of the opening of the seed metal 40. As illustrated in FIG. 6F, an exposed area of the seed metal 40 is covered with Cu composing the etching mask 50.

In the processes of FIG. 6A to FIG. 6E, a material composing the etching mask 50 is plated after a patterning of the seed metal 40. In the processes of FIG. 4A to FIG. 4E, the removing process of the resist mask 90 and the removing process of the seed metal 40 are performed after the forming process of the etching mask 50. Therefore, a process device for the removing processes may be contaminated by Cu that is a material composing the etching mask 50. However, in the embodiment, a formation of an etching mask is finished when the etching mask 50 is formed. Therefore, the contamination of the process device by Cu is more restrained, compared to the processes of FIG. 4A to FIG. 4E. Accordingly, device property degradation, reliability degradation or the like of the semiconductor device 100 is restrained.

A reaction between Ni component of the seed metal 40 and the fluorine-based gas is restrained during the dry etching process of the SiC substrate 10, because the seed metal 40 is covered with the etching mask 50. Therefore, the residue of Ni fluoride is more restrained.

EXAMPLES

A semiconductor device was manufactured with the manufacturing method in accordance with the above-embodiment. And the characteristics of the semiconductor device were measured.

In an example, a semiconductor device was manufactured with the manufacturing method in accordance with the modified embodiment of the first embodiment. A Cu mask (10 μm) plated on the seed metal 40 was used as the etching mask 50. An Au (200 nm)/NiCr (50 nm) was used as the seed metal 40.

A condition of the dry etching process of FIG. 2E is as follows. An ICP etching device was used as the dry etching device. $SF_6$ gas was used as the etching gas. A vacuum degree was 0.1 MPa to 10.0 Mpa. The high-density plasma formation electrical power of the ICP etching device was 100 W to 3000 W. A bias electrical power of the ICP etching device was 10 W to 1000 W. In the process of FIG. 2E, the dry etching process was stopped before an exposing of the GaN-based semiconductor layer 11.

In the etching process of the etching mask 50, nitric acid was used as the etching liquid. In the etching process of Au of the seed metal 40, an Au-based etching liquid was used as the etching liquid. In the etching process of NiCr of the seed metal 40, a concentrated hydrochloric acid was used as the etching liquid.

Comparative Example

In a comparative example, an etching mask made of nickel was used instead of the etching mask 50. Etching conditions of the processes of FIG. 2E to FIG. 2F were the same as the example.

Figure 7A:
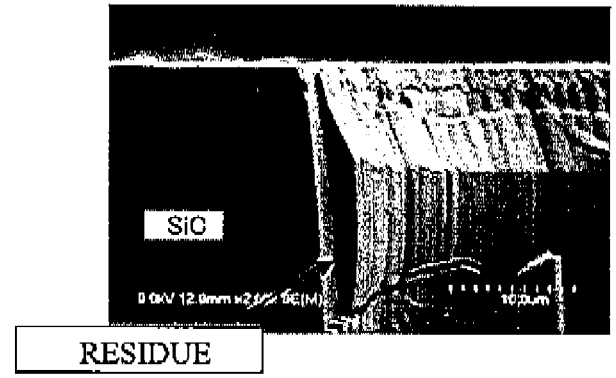
FIG. 7A to FIG. 7C illustrate observation results of a semiconductor device manufactured with a manufacturing method in accordance with a comparative example.

FIG. 7A illustrates a SEM (Scanning Electron Microscope) photograph of an inner wall of the via hole of a semiconductor device manufactured with a manufacturing method in accordance with the comparative example. As illustrated in FIG. 7A, a residue was adhered to the inner wall of the via hole in the comparative example. Ni fluoride was detected when the residue was subjected to an X-ray diffraction measurement. Therefore, it is demonstrated that nickel was left as the residue in the manufacturing method in accordance with the comparative example. In contrast, in the above-example, a residue was hardly detected. It is thought that this is because the residue was dissolved into a chemical liquid in the etching process of the GaN-based semiconductor layer 11.

Figure 7B:
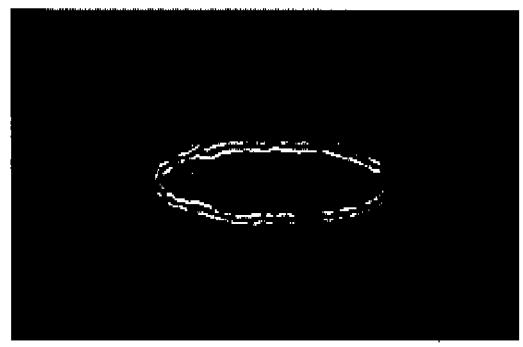
Figure 7C:

An adhesiveness between the inner wall of the via hole and the PHS 70 is degraded when the residue was left on the inner wall of the via hole. Therefore, the surface source pad 12 may be deformed or broken because of thermal expansion and thermal contraction of the PHS 70 in the via hole according to temperature changing. And so, the surface source pad 12 was observed with a microscope. FIG. 7B illustrates a metallograph photograph of the surface of the surface source pad 12 of the semiconductor device manufactured with the manufacturing method in accordance with the comparative example. As illustrated in FIG. 73, an outline of the via hole was observed with a line. It is thought that this is because the surface source pad 12 was deformed and broken. FIG. 7C illustrates a SEM photograph of the surface source pad 12 of the semiconductor device manufactured with the manufacturing method in accordance with the comparative example. As illustrated in FIG. 7C, it was observed that the surface source pad 12 was falling toward the via hole and was broken. It is thought the falling and the breaking were caused by the thermal expansion and the thermal contraction of the PHS 70.

Next, a surface source pad of a sample chip subjected to a temperature cycle test (−65 degrees C. to 150 degrees C., 500 cycles) was observed. And, the number of breaking area of the surface source pad 12 was measured. 300 surface source pads 12 were observed with respect to the example and the comparative example. Table 1 shows the observation result.

TABLE 1

|  | THE NUMBER OF BREAKING |
|---|---|
| COMPARATIVE EXAMPLE (Ni MASK) | 261/300 |
| EXAMPLE (Cu MASK) | 0/300 |

As shown in Table 1, the breaking was observed in 261 of the 300 surface source pads with respect to the comparative example. In contrast, the breaking of the surface source pad 12 was not observed with respect to the example. The result shows that residual in a via hole of a semiconductor device is restrained when the manufacturing method of the example is used.

The present invention is not limited to the specifically described embodiments and variations but other embodiments and variations may be made without departing from the scope of the claimed invention.

What is claimed is:

1. A manufacturing method of a semiconductor device comprising:
   forming step of forming an etching mask on a second main face of a substrate, the etching mask being made of Cu or Cu alloy and having an opening, the second main face being on an opposite side of a first main face of the substrate where a nitride semiconductor layer is provided;
   a first etching step of applying a dry etching to the second main face of the substrate with use of the etching mask so that all of or a part of the nitride semiconductor layer is left;
   a removing step of completely removing the etching mask from the second main face of the substrate after the first etching step; and
   a second etching step of dry-etching the left nitride semiconductor layer after the removing step.

2. The method as claimed in claim 1, wherein the dry etching is stopped before the nitride semiconductor layer is exposed in the first etching step.

3. The method as claimed in claim 1, wherein:
   an etching rate of the substrate is higher than that of the nitride semiconductor layer in the first etching step; and
   an etching rate of the nitride semiconductor layer is higher than that of the substrate in the second etching step.

4. The method as claimed in claim 3, wherein:
   fluorine-based gas is used as an etching gas in the first etching step; and
   chlorine-based gas is used as an etching gas in the second etching step.

5. The method as claimed in claim 1, wherein the second etching step and the removing step are performed in a single etching step.

6. The method as claimed in claim 5, wherein the single etching step is performed in a same etching chamber.

7. The method as claimed in claim 1, further comprising an etching mask formation step of forming the etching mask by plating with use of a metal layer having a pattern on the second main face of the substrate as a seed metal.

8. The method as claimed in claim 7, wherein the seed metal includes a Ni layer or a Ni alloy layer.

9. The method as claimed in claim 1, wherein the substrate is a SiC substrate.

10. The method as claimed in claim 1, wherein the nitride semiconductor layer is a GaN-based semiconductor layer.

11. The method as claimed in claim 1, wherein a via hole is formed in the substrate with the first etching step and the second etching step.

12. The method as claimed in claim 1, wherein a fluorine-based gas is used as an etching gas in the first etching step.

* * * * *